(12) United States Patent
Setz et al.

(10) Patent No.: US 9,761,840 B2
(45) Date of Patent: Sep. 12, 2017

(54) ORGANIC LIGHT-EMITTING DIODE

(71) Applicant: OSRAM OLED GmbH, Regensburg (DE)

(72) Inventors: Daniel Steffen Setz, Böblingen (DE); Erwin Lang, Regensburg (DE); Marc Philippens, Regensburg (DE)

(73) Assignee: OSRAM OLED GmbH (DE)

( * ) Notice: Subject to any disclaimer, the term of this patent is extended or adjusted under 35 U.S.C. 154(b) by 0 days.

(21) Appl. No.: 14/409,054

(22) PCT Filed: Jun. 17, 2013

(86) PCT No.: PCT/EP2013/062536
§ 371 (c)(1),
(2) Date: Dec. 18, 2014

(87) PCT Pub. No.: WO2013/189894
PCT Pub. Date: Dec. 27, 2013

(65) Prior Publication Data
US 2015/0144901 A1  May 28, 2015

(30) Foreign Application Priority Data
Jun. 21, 2012 (DE) .................. 10 2012 210 494

(51) Int. Cl.
*H01L 29/08* (2006.01)
*H01L 51/52* (2006.01)

(52) U.S. Cl.
CPC ...... *H01L 51/5268* (2013.01); *H01L 51/5203* (2013.01); *H01L 51/5215* (2013.01); *H01L 51/5265* (2013.01)

(58) Field of Classification Search
CPC ............. H01L 51/5268; H01L 51/5271; H01L 2924/12044; H01L 51/5203
See application file for complete search history.

(56) References Cited

U.S. PATENT DOCUMENTS

2004/0061136 A1* 4/2004 Tyan .................. H01L 51/5268
257/200
2004/0227460 A1* 11/2004 Liao .................... H01L 51/5278
313/506

(Continued)

FOREIGN PATENT DOCUMENTS

DE  10 2005 027 961 A1  1/2007
DE  10 2008 018 663 A1  10/2009

(Continued)

OTHER PUBLICATIONS

Young Rag Do et al., "Enhanced Light Extraction from Organic Light-Emitting Diodes with 2D $SiO_2/SiN_x$ Photonic Crystals," Advanced Materials, vol. 15, No. 14, Jul. 2003, pp. 1214-1218, Wiley-VCH Verlag GmbH & Co. KGaA, Weinheim.

(Continued)

*Primary Examiner* — Khiem D Nguyen
(74) *Attorney, Agent, or Firm* — DLA Piper LLP (US)

(57) ABSTRACT

An organic light-emitting diode includes a carrier substrate, a scattering layer, a first electrode, an organic layer sequence with at least one active layer, and a second electrode wherein all the components are arranged in the stated sequence, the scattering layer has a higher average refractive index than the organic layer sequence, the first electrode has at least n or at least n+1 non-metal layers and n metal layers, n is a natural number greater than or equal to 1 or greater than or equal to 2, and the non-metal layers and the metal layers succeed one another alternately.

20 Claims, 4 Drawing Sheets

(56) References Cited

U.S. PATENT DOCUMENTS

| | | | |
|---|---|---|---|
| 2006/0006795 A1* | 1/2006 | Strip | H01L 51/5265 313/504 |
| 2006/0220539 A1* | 10/2006 | Cok | H01L 51/5268 313/506 |
| 2006/0240278 A1* | 10/2006 | Hatwar | H01L 51/5278 428/690 |
| 2007/0077349 A1 | 4/2007 | Newman et al. | |
| 2007/0257608 A1 | 11/2007 | Tyan et al. | |
| 2007/0284601 A1* | 12/2007 | Khanarian | H01L 33/22 257/98 |
| 2008/0142780 A1* | 6/2008 | Bader | H01L 33/405 257/13 |
| 2008/0143249 A1 | 6/2008 | Lee et al. | |
| 2009/0146929 A1 | 6/2009 | Kim et al. | |
| 2010/0072884 A1 | 3/2010 | Tchakarov et al. | |
| 2011/0037379 A1* | 2/2011 | Lecamp | H01L 51/5215 313/503 |
| 2011/0050082 A1* | 3/2011 | Inoue | H01L 51/5268 313/483 |
| 2011/0140141 A1* | 6/2011 | Hahn | H01L 33/0079 257/94 |
| 2012/0091459 A1 | 4/2012 | Choi et al. | |

FOREIGN PATENT DOCUMENTS

| | | |
|---|---|---|
| DE | 10 2012 200 244 A1 | 7/2013 |
| EP | 1 406 474 A1 | 4/2004 |
| EP | 1 478 025 A2 | 11/2004 |
| JP | 2008-251217 A | 10/2008 |
| WO | 2008/059185 A2 | 5/2008 |
| WO | 2012/007575 A1 | 1/2012 |

OTHER PUBLICATIONS

Jonathan M. Ziebarth et al., "Extracting Light from Polymer Light-Emitting Diodes Using Stamped Bragg Gratings," Advanced Functional Materials, vol. 14, No. 5, May 2004, pp. 451-456, Wiley-VCH Verlag GmbH & Co., KGaA, Weinheim.

Yiru Sun et al., "Enhanced light out-coupling of organic light-emitting devices using embedded low-index grids," Nature Photonics, vol. 2, Aug. 2008, pp. 483-487, Macmillan Publishers Limited.

* cited by examiner

ORGANIC LIGHT-EMITTING DIODE

TECHNICAL FIELD

This disclosure relates to an organic light-emitting diode.

BACKGROUND

There is a need to provide an organic light-emitting diode having high light outcoupling efficiency.

SUMMARY

We provide an organic light-emitting diode including a carrier substrate, a scattering layer, a first electrode, an organic layer sequence with at least one active layer, and a second electrode wherein all the components are arranged in the stated sequence, the scattering layer has a higher average refractive index than the organic layer sequence, the first electrode has at least n or at least n+1 non-metal layers and n metal layers, n is a natural number greater than or equal to 1 or greater than or equal to 2, and the non-metal layers and the metal layers succeed one another alternately.

DETAILED DESCRIPTION

Figure 1:
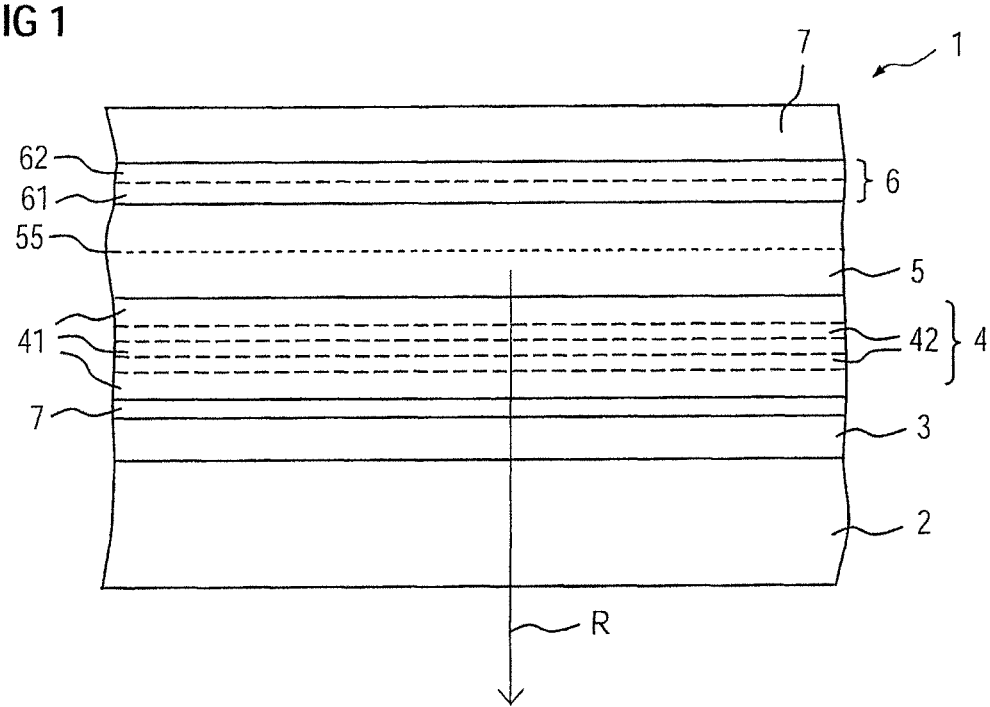
FIGS. 1 to 3, 6 and 7 are schematic sectional representations of examples of organic light-emitting diodes.

Our organic light-emitting diode comprises a carrier substrate. The carrier substrate is preferably transmissive to radiation. The carrier substrate may in particular be transparent. The carrier substrate, for example, comprises a glass sheet, a glass film, a plastics sheet or a plastics film. Likewise, the carrier substrate may comprise a ceramic or consist of a ceramic. Apparatus for electrical and/or mechanical contacting of the light-emitting diode may be mounted on the carrier substrate.

The light-emitting diode may comprise a scattering layer. The scattering layer scatters radiation generated during operation of the light-emitting diode. For example, the scattering layer has a greater scattering effect in the lateral direction, i.e., parallel to main directions of extension of the carrier, than in the direction perpendicular to the carrier. In other words, it is possible that substantially only radiation is then scattered which propagates parallel or almost parallel to the carrier substrate. Radiation extending perpendicular to the carrier substrate is preferably not or not significantly impaired by the scattering layer. The scattering layer may thus appear transparent in plan view onto the carrier substrate. This may be achieved by a relatively low concentration of scattering centers.

In contrast thereto, the scattering layer may however also have a more strongly scattering effect such that the light-emitting diode looks opaque and/or diffusely reflecting to an observer when switched off.

The organic light-emitting diode may contain a first electrode. The first electrode is preferably an anode. Alternatively, however, the first electrode may also take the form of a cathode. Furthermore, the first electrode is preferably radiation-transmissive, in particular transparent, to radiation generated when the light-emitting diode is in operation.

The organic light-emitting diode may comprise one or more organic layer sequences. The at least one organic layer sequence contains at least one active layer. The active layer is based on or consists of at least one organic material and generates in particular visible radiation when the light-emitting diode is in operation. In addition to the at least one active layer, the organic layer sequence may also contain further layers. Such further layers are in particular charge carrier injection layers, charge carrier generation layers, charge carrier barrier layers and/or charge carrier transport layers.

The organic light-emitting diode may comprise a second electrode. The second electrode is preferably a cathode. The second electrode is furthermore preferably radiation-opaque and reflective to radiation generated when the light-emitting diode is in operation. As a result of the second electrode, the light-emitting diode may act as a mirror when turned off, preferably as a specularly reflecting mirror.

The following stated components may be arranged in the stated sequence: the carrier substrate, the scattering layer, the first electrode, the organic layer sequence with the organic layer and the second electrode. It is possible for the above-stated components to succeed one another at least to the part directly or for further layers to be introduced between the above-stated components. The stated layers are preferably oriented parallel to one another and are in each case flat and planar shaped.

The scattering layer may have a higher average refractive index than the organic layer sequence. This applies at least to a peak wavelength of the radiation generated when the light-emitting diode is in operation. It is likewise possible for this condition to apply to the refractive index for all the wavelengths generated when the light-emitting diode is in operation. The peak wavelength is, for example, that wavelength at which a maximum spectral energy density is emitted by the light-emitting diode when used correctly. The average refractive index of the scattering layer amounts, for example, to at least 1.1 times or at least 1.2 times the average refractive index of the organic layer sequence.

The first electrode may comprise non-metal layers and metal layers. The term non-metal layers means that these layers are not predominantly based on a metal and in terms of their physical properties, in particular with regard to radiation-transmissibility, do not behave like metals from a macroscopic, i.e., bulk, standpoint. A non-metal layer material preferably comprises a conductive, transparent oxide.

Transparent conductive oxides ("TCOs" for short) are transparent, conductive materials, generally metal oxides, such as, for example, zinc oxide, tin oxide, cadmium oxide, titanium oxide, indium oxide or indium tin oxide, ITO for short. In addition to binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. Furthermore, TCOs do not necessarily correspond to a stoichiometric composition and may also be p- or n-doped.

The term metal layers may mean that these layers consist, to an extent of at least 95 atom % or at least 99 atom % or at least 99.8 atom %, of metals. The metal layers preferably have a lower average geometric thickness than the non-metal layers.

The first electrode may comprise at least or precisely n or at least or precisely n+1 non-metal layers and n metal layers.

In this case, n is a natural number ≥1 or ≥2. For example, n=2 or n=3 or n=4 or n=5 or n=6. Preferably, the number of non-metal layers is increased precisely by 1 or by 2 or by 3 or by 4 relative to the number of metal layers.

The metal layers and the non-metal layers may alternate with one another. In particular, the non-metal layers and the metal layers may in each case succeed one another directly such that adjacent metal layers and non-metal layers are in mutual contact. Particularly preferably, there is no further layer between the non-metal layers and the metal layers and there are also no inclusions between the metal layers and the non-metal layers.

The organic light-emitting diode may comprise a carrier substrate, a scattering layer, a first electrode, an organic layer sequence with at least one active layer and a second electrode. All the above-stated components succeed one another in the stated sequence. The scattering layer has a higher average refractive index than the organic layer sequence. The first electrode contains at least n or at least n+1 non-metal layers and n metal layers. n is a natural number ≥1 or ≥2. The non-metal layers and the metal layers succeed one another alternately.

With a first electrode being structured in this way, it is possible in particular to achieve improved optical coupling of the radiation generated in the organic layer sequence to the scattering layer and/or to the carrier substrate. In this way, it is possible to increase a light outcoupling efficiency of radiation out of the light-emitting diode.

The second electrode may be reflective and the first electrode may be radiation-transmissive to radiation generated in the light-emitting diode when in operation. Radiation outcoupling out of the light-emitting diode proceeds through the carrier substrate. This means that the majority or substantially all of the radiation generated in the light-emitting diode is coupled out of the light-emitting diode at the carrier substrate. Then no or only a negligible proportion of the radiation generated when the light-emitting diode is in operation is emitted at the side of the light-emitting diode on which the second electrode is located, or at end faces.

The metal layers of the first electrode may comprise one or more of the metals stated below or consist of one or more of the metals stated below: Ag, Al, Au, Cd, Co, Cr, Cu, Ge, In, Mg, Mn, Mo, Ni, Pd, Pt, Si, Sn, Ti, Zn and Zr. The metal layers preferably consist of silver or of a silver alloy.

The metal layers may each have a thickness of at least 1.0 nm or of at least 1.5 nm or of at least 2 nm. Alternatively or in addition, the thickness of the metal layers in each case amounts to at most 10 nm or at most 7.5 nm or at most 5 nm. In other words, a thickness of the metal layers preferably amounts to at most 0.5 or at most 0.25 of the so-called "skin depth" for a material of the metal layers. The metal layers are thus so thin that they are at least in part radiation-transmissive.

The first electrode may comprise peripheral non-metal layers. The peripheral non-metal layers are on the one hand that non-metal layer located closest to the organic layer sequence and, moreover, that one of the non-metal layers located closest to the carrier substrate. The peripheral non-metal layers each preferably have a thickness of at least 5 nm or of at least 12.5 nm or of at least 30 nm. Alternatively or in addition, the thickness of the peripheral non-metal layers amounts to at most 70 nm or at most 50 nm or at most 25 nm. It is also possible for the stated numerical values or some of the stated numerical values to apply solely to one of the peripheral non-metal layers. Preferably, the non-metal layer closest to the carrier substrate is thicker, for example, by at least a factor of 1.5 than the peripheral non-metal layer closest to the organic layer sequence.

The non-peripheral non-metal layers may have a thickness of at least 50 nm or of at least 70 nm or of at least 100 nm. Alternatively or in addition, this thickness amounts to at most 250 nm or at most 180 nm or at most 140 nm. In this respect, it is possible for all the non-peripheral metal layers to have the same thickness or to have different thicknesses.

One or at least one or all of the non-peripheral non-metal layers may have an optical thickness of $(m\lambda)/2$, with a tolerance of at most $0.1\lambda$ or of at most $0.05\lambda$. In this case, m is a natural number ≥1. $\lambda$ denotes the peak wavelength of the radiation generated in the organic layer sequence. In other words, it is possible for the first electrode to be of similar structure to a Fabry-Perot component.

The second electrode may comprise at least two or precisely two sublayers. The sublayers are formed of various materials and/or of various material compositions.

The first sublayer, which is closer to the organic layer sequence, may comprise a transparent conductive oxide and/or silver. The second sublayer of the second electrode located further away from the organic layer sequence may alternatively or additionally contain silver, a silver alloy, aluminium or an aluminium alloy.

The first sublayer may have a thickness of at least 20 nm or of at least 30 nm. Alternatively or in addition, the thickness of the first sublayer is at most 60 nm or at most 50 nm. The first sublayer preferably has a smaller thickness than the second sublayer. A thickness of the second sublayer is, for example, at least 40 nm or at least 70 nm and, for example, at most 200 nm or at most 150 nm.

The second electrode may comprise a metal selected from Ag, Al, Au, Ba, Ca, Cs, Cu, Ge, In, Li and Mg and compounds, combinations and alloys thereof. In particular, the second electrode or at least one sublayer of the second electrode is formed from Ag, Al or alloys thereof, for example, Ag:Mg, Ag:Ca, Ag:Ge, Mg:Al. Alternatively or in addition, the second electrode may also comprise one of the TCO materials mentioned in relation to the first electrode.

The scattering layer may comprise a matrix material and scattering centers embedded therein. A refractive index of the matrix material is preferably at least 1.65 or at least 1.8 or at least 1.85 or at least 1.9. The matrix material is, for example, an optically highly refractive glass or a polymer-based material. Polymeric materials are, for example, polycarbonate, abbreviated to PC, polyethylene naphthalate, abbreviated to PEN, polyethylene terephthalate, abbreviated to PET, polyurethane, abbreviated to PU, polymethyl methacrylate, abbreviated to PMMA, or epoxides.

The scattering centers may be cavities in the scattering layer. Likewise, the scattering centers may be formed by particles, for example, from or with silicon dioxide, titanium dioxide, zirconium dioxide, hafnium oxide, tantalum oxide or aluminium oxide. An average diameter of the cavities or the particles is, for example, 0.15 µm to 20 µm, in particular 0.3 µm to 5 µm. A refractive index difference between the matrix material and a material of the scattering centers is preferably at least 0.1 or at least 0.2.

If the scattering centers are cavities or pores, the material of the scattering centers is, for example, a gas such as dried air or nitrogen or argon. The cavities may alternatively be evacuated. In this context, vacuum is then likewise understood as a material.

The scattering layer may have an average geometric thickness of at least 2.5 µm or of at least 1 µm. Alternatively or in addition, the average thickness of the scattering layer is at most 50 µm. Preferably, the thickness of the scattering layer is 5 µm to 25 µm.

The organic layer sequence may comprise at least two active layers which succeed one another in the direction away from the carrier substrate. The various active layers may generate radiation of the same wavelength or generate radiation of different wavelengths.

At least one of the active layers or all of the active layers may be at an optical distance from the second electrode which amounts to an uneven multiple of a quarter of the peak wavelength of the radiation generated in the respective active layer. The position of the respective active layer preferably displays a respective peak wavelength tolerance of at most 0.1 or of at most 0.05. In particular, at least one or at least two of the active layers is/are present at an optical distance of $\frac{3}{4}\lambda$ from the second electrode.

The organic light-emitting diode may contain at least one charge carrier generation layer. The charge carrier generation layer is preferably located between two adjacent active layers. A distance between the adjacent active layers and a distance between the active layers and the second electrode may be adjusted by the charge carrier generation layer.

The charge carrier generation layer may contain an n-conductive and a p-conductive layer. An interlayer of the charge carrier generation layer is preferably located between the n-conductive layer and the p-conductive layer.

The interlayer has a thickness of at least 0.8 nm or of at least 1.0 nm or of at least 1.75 nm. Alternatively or in addition, the thickness of the interlayer is at most 4.5 nm or at most 3.5 nm. It is possible for the interlayer to be formed from a radiation-opaque material, from a macroscopic standpoint. For example, the interlayer comprises a metal, a metal oxide and/or a metal halide or consists thereof.

An optoelectronic semiconductor component described here is explained in greater detail below by way of examples and with reference to the drawings. Elements which are the same in the individual figures are indicated with the same reference numerals. The relationships between the elements are not shown to scale, however, but rather individual elements may be shown exaggeratedly large to assist in understanding.

FIG. 1 shows an example of an organic light-emitting diode 1. The light-emitting diode 1 comprises a carrier substrate 2. A scattering layer 3 is applied to the carrier substrate 2. In the direction away from the carrier substrate 2, the scattering layer 3 is followed by a first electrode 4, for example, an anode. After the first electrode 4 there is arranged an organic layer sequence 5 with an active layer 55 that generates radiation. A second electrode 6 is located on the side of the organic layer sequence 5 remote from the carrier substrate 2.

An encapsulation layer 7 is optionally located between the scattering layer 3 and the first electrode 4 and on the side of the second electrode 6 remote from the carrier substrate 2. The encapsulation layer 7 protects the organic layer sequence and the electrodes 4, 6 from environmental influences such as moisture and/or oxygen. The encapsulation layers 7 are formed, for example, by an oxide or a nitride, which is in particular dielectric. A thickness of the encapsulation layer 7 is, for example, 0.2 nm to 10 µm or 1.5 nm to 1 µm or 1.5 nm to 400 nm. In contrast to the representation in FIG. 1, it is possible, as in all the other examples, for the encapsulation layer 7 to be composed of a plurality of sublayers, wherein these sublayers may be formed from various materials.

The organic layer sequence 5 with the active layer 55 shown symbolically by a dotted line is illustrated merely in simplified manner. Further layers such as charge carrier injection layers, charge carrier transport layers, charge carrier generation layers and charge carrier barrier layers are not shown in FIG. 1.

The scattering layer 3 has a comparatively high optical refractive index, in particular relative to the organic layer sequence 5. The scattering layer 3 comprises scattering centers having a refractive index different from a matrix material.

The second electrode 6 is reflective to radiation R generated in the organic layer sequence 5. The radiation R is coupled out of the light-emitting diode 1 through the carrier substrate 2, through the scattering layer 3 and through the first electrode 4.

The first electrode 4 comprises non-metal layers 41 and metal layers 42, separated from one another in the figures by dashed lines. The layers 41, 42 succeed one another alternately and directly. On both sides of each the metal layers 42 there is located one of the non-metal layers 41. Peripheral layers of the first electrode 4 are thus formed by the non-metal layers 41. The non-metal layers 41 are preferably made of ITO. A preferred material for the metal layers 42 is silver.

The metal layers 42 each have, for example, a thickness of less than 5 nm, in particular around 3 nm. A thickness of the non-metal layer 41 closest to the active layer 55 is preferably 5 nm to 20 nm. The middle one of the non-metal layers 41 may have a thickness of 100 nm to 140 nm. The non-metal layer 41 closest to the scattering layer 3 has, for example, a thickness of 40 nm to 60 nm.

Optionally, as also in all the other examples, it is possible for the second electrode 6 likewise to comprise a plurality of sublayers 61, 62. Preferably the second electrode 6 comprises precisely two sublayers 61, 62. The sublayer 61 closest to the organic layer sequence 5, for example, comprises a silver layer or a silver-containing layer. The first sublayer 61, for example, has a thickness of 30 nm to 50 nm. Likewise, the first sublayer may be formed of a transparent conductive oxide or of a combination of a transparent conductive oxide and a reflective metal such as silver. The second sublayer 62, which is further away from the organic layer sequence 5, is then formed, for example, of aluminium or an aluminium alloy and may have a thickness of around 100 nm.

Unlike in the illustration, it is likewise possible for the second electrode 6 to be formed only by a single layer. In this case, the second electrode 6 is preferably formed from silver or aluminium or from alloys such as Ag:Mg, Ag:Ca, Ag:Ge or Mg:Al. Furthermore, the second electrode 6 may also comprise more than two sublayers, in particular three sublayers. In this case, a metal layer is preferably located between two layers of a transparent conductive oxide. In addition, it is possible for the second electrode 6 to take the form of a Bragg mirror with a sequence of many layers of alternately high and low refractive index.

The first electrode 4 may also comprise material compositions and geometries, in particular as stated in conjunction with US 2010/0072884 A1, the subject matter of which is incorporated by reference. Features relating to the scattering layer 3 are also stated in US 2007/0077349 A1, the subject matter of which is incorporated by reference. Those publications additionally describe organic layer sequences.

Moreover, it is possible, unlike in the illustration according to FIG. 1, for the first electrode 4 to have a number of non-metal layers 41 greater by two or more than the number of metal layers 42. For example, two or three of the non-metal layers 41 are located between two adjacent metal layers 42, wherein these non-metal layers 41 may then have different material compositions.

Figure 2:
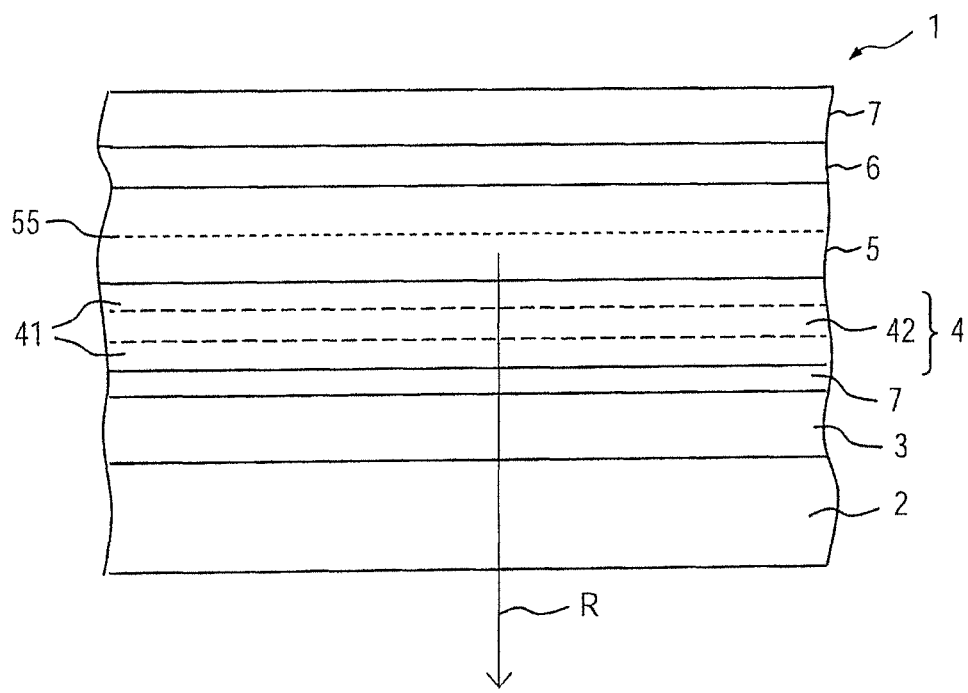

FIG. 2 shows a further example of the organic light-emitting diode 1. According to FIG. 2, the first electrode 4 comprises just three sublayers in total, two non-metal layers 41 and one metal layer 42, which is located between the two non-metal layers 41.

A thickness of the metal layer 42 is then preferably increased relative to the example according to FIG. 1. The thickness of the metal layer 42 is, for example, 6 nm to 8 nm. A thickness of the non-metal layer 41 closest to the carrier substrate 2 is, for example, 30 nm to 80 nm or 40 nm to 50 nm. The non-metal layer 41 facing the organic layer sequence 5 has a thickness, for example, of 10 nm to 40 nm or 15 nm to 25 nm. The two non-metal layers 41 are formed in particular of a TCO such as ITO. The metal layer 42 is preferably formed from silver. If materials other than silver and ITO are used, the layer thicknesses of the layers 41, 42 must be appropriately adapted.

Figure 3:
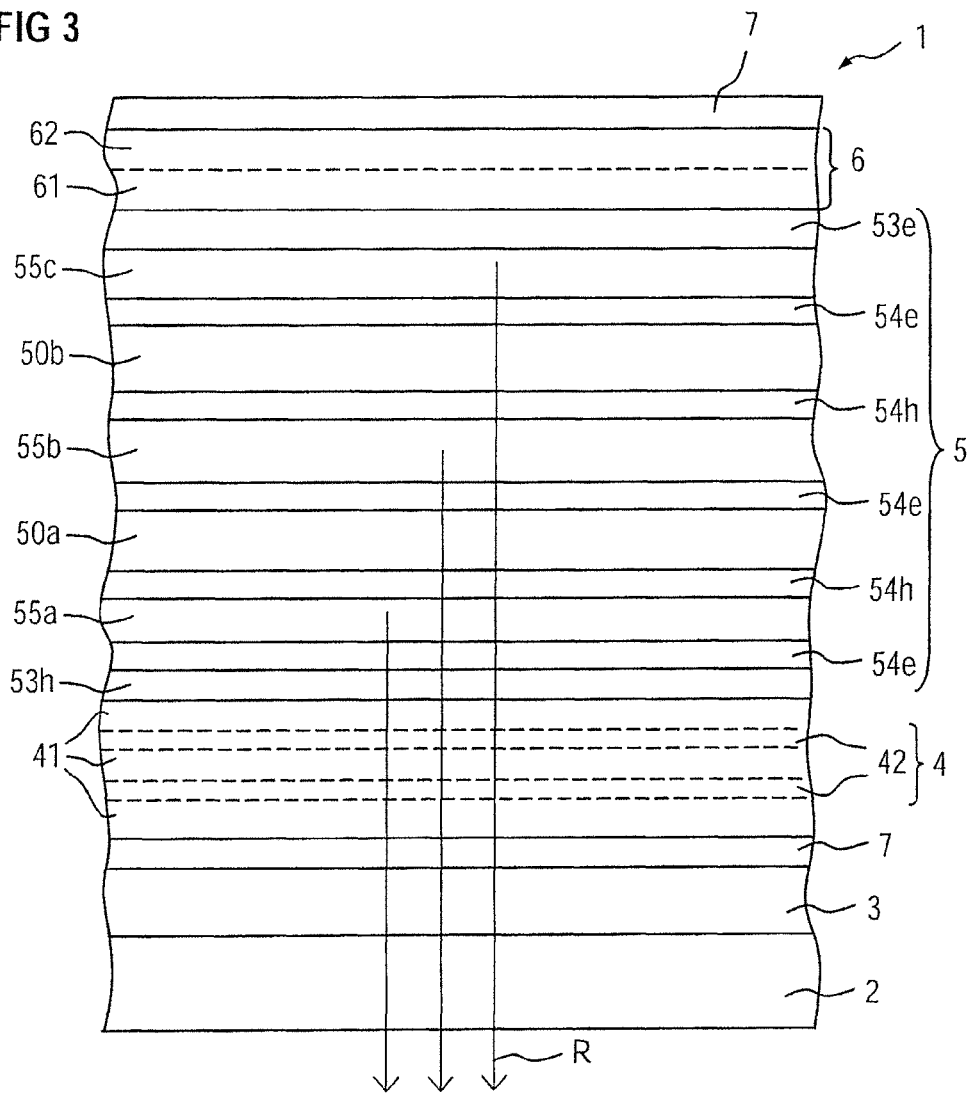

In the example of the light-emitting diode 1 according to FIG. 3, the organic layer sequence 5 is shown in more detail. The details relating to individual layers of the organic layer sequence 5 may also be applied to all the other examples. The electrodes 4, 6 according to FIG. 3 are formed in particular as described in relation to FIG. 1 or 2.

The organic layer sequence 5 comprises a plurality of active layers 55a, 55b, 55c. Electron barrier layers 54e and/or hole barrier layers 54h may be located on each of the active layers 55a, 55b, 55c. Charge carrier generation layers 50a, 50b are located between adjacent active layers 55a, 55b, 55c. The charge carrier generation layers 50a, 50b may be configured as stated in US 2008/0143249 A1 and/or US 2009/0146929 A1, the subject matter of which is incorporated by reference.

The charge carrier generation layers 50a, 50b make it possible to adjust a distance between the adjacent active layers 55a, 55b, 55c. A distance between each of the active layers 55a, 55b, 55c and the reflective, second electrode 6 is preferably an uneven-numbered multiple of a quarter of the peak wavelength of the radiation R generated in the respective active layer 55a, 55b, 55c.

An electron injection layer 53e may be located on the second electrode 6. A hole injection layer 53h is preferably applied to the first electrode 4. A thickness of the entire organic layer sequence 5 is, for example, 100 nm to 1 μm or 200 nm to 700 nm.

The respective organic layers of the organic layer sequence 5 may be doped. The individual layers preferably have a high radiation-transmissibility in the visible spectral range, i.e., in particular 450 nm to 780 nm. These layers preferably comprise an absorption coefficient of at most 0.0005/mm or of at most 0.0001/mm.

With such an organic light-emitting diode 1, the light outcoupling efficiency may be increased. Although electrical conductivity can be reduced by a first electrode 4 constructed as stated, improved light outcoupling is however achievable. In this way, lower current densities may be achieved overall. This is achieved in particular by the combination of the first electrode 4 with the scattering layer 3 and the carrier substrate 2.

Figure 4:
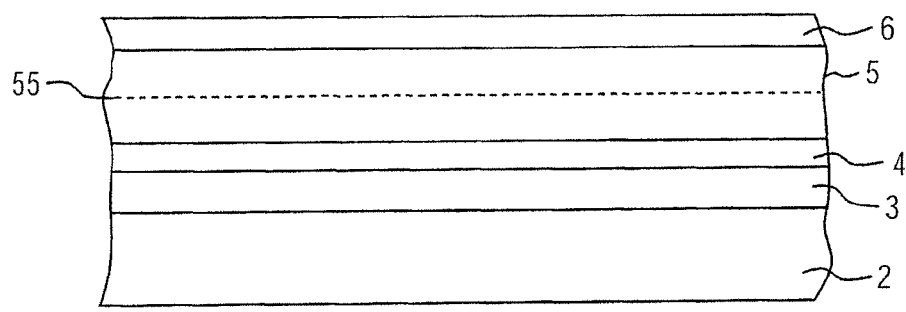
FIG. 4 is a sectional representation of a conventional organic light-emitting diode.

FIG. 4 shows a conventional organic light-emitting diode. In such light-emitting diodes the first electrode 4 is formed by a single layer.

Figure 5:
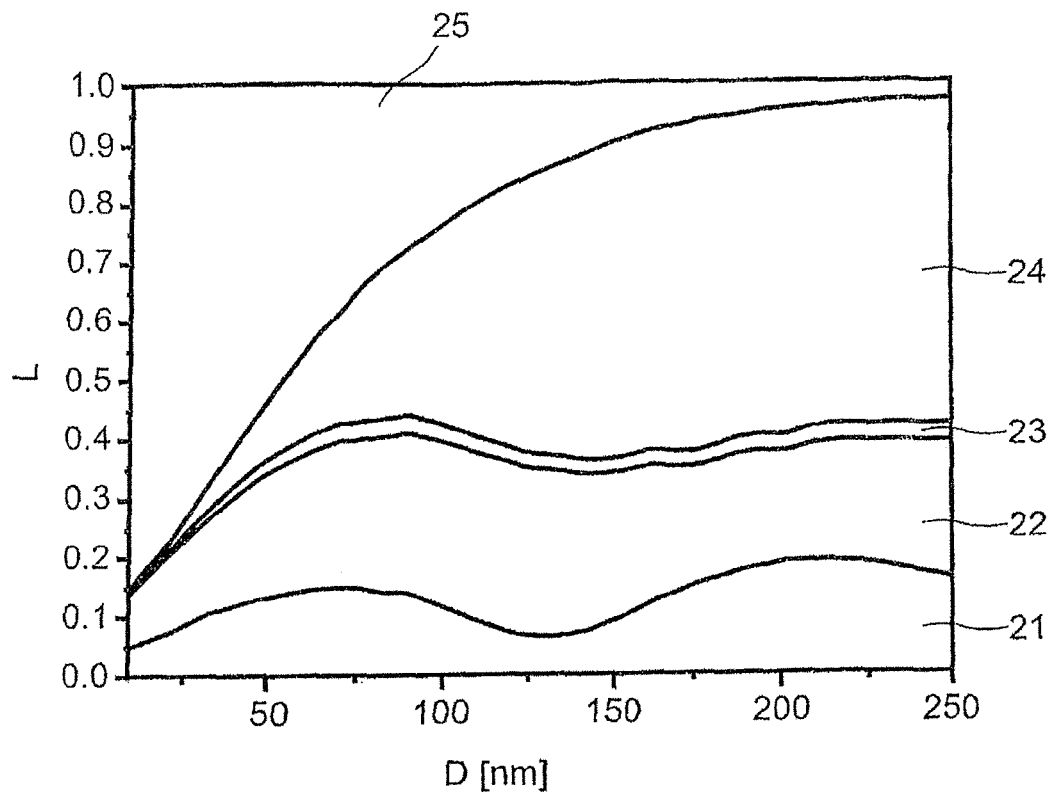
FIG. 5 is a schematic illustration of optical loss channels arising in organic light-emitting diodes.

Loss channels arising in light-emitting diodes are illustrated in conjunction with FIG. 5. The relative proportion of power L is plotted relative to the distance D of the active layer 55 from the reflective, second electrode 6. The region 21 indicates the relative proportion of the radiation R generated in the active layer 55 coupled out from the carrier substrate 2. The region 22 corresponds to the proportion of the radiation R guided in the carrier substrate 2 by wave guidance. The region 23 indicates the relative proportion of the radiation R lost by absorption in the organic layer sequence 5, the first electrode 4 and the carrier substrate 2. The region 24 indicates the proportion of the radiation guided in the first electrode 4 and the organic layer sequence 5 by wave guidance effects. Finally, the region 25 indicates the proportion of radiation which is lost through the incoupling of surface plasmons into the second electrode 6.

The proportion of radiation 21 coupled out of the carrier substrate 2 has a sinusoidal profile relative to the distance D from the second electrode 6. As the value of the distance D increases, the loss channel 25 caused by the plasmon incoupling decreases considerably, whereby the relative proportion 24 of the radiation guided in the organic layer sequence 5 and the first electrode 4 increases. In particular, the proportion 25 of the plasmon loss channel amounts to less than 10% for a value of D of greater than or equal to 150 nm. The active layer 55 is thus preferably in or close to the maximum of the proportion 21 at a distance D of approximately 210 nm. The stated values relate to a refractive index of roughly 1.8. In the case of a different refractive index, the stated values vary accordingly.

Figure 6:
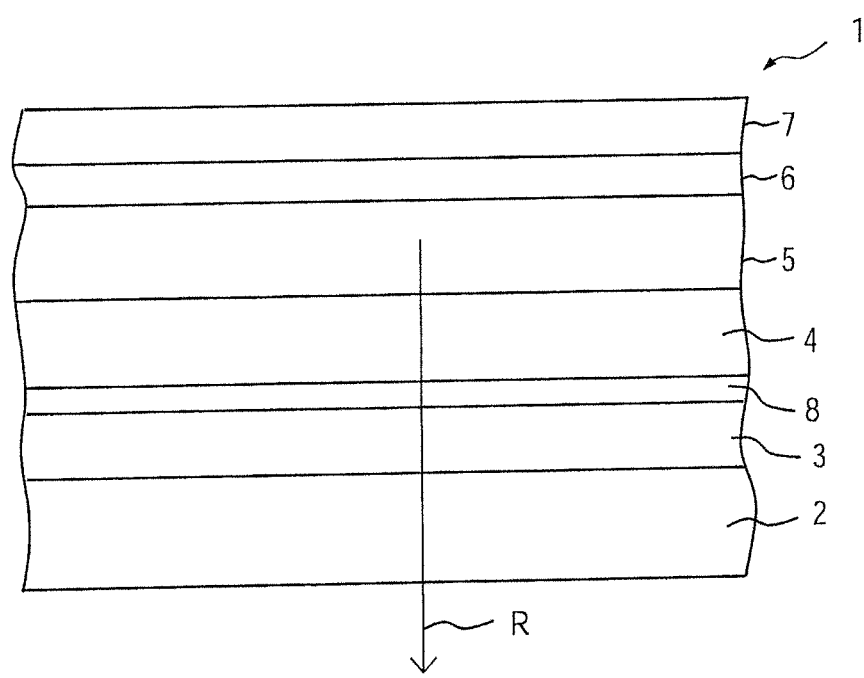

FIG. 6 shows a further example of the light-emitting diode 1. Between the scattering layer 3 and the first electrode 4, which is constructed, for example, as stated in relation to FIGS. 1 to 3, there is located a planarization layer 8. Unlike in the illustration, a plurality of planarization layers 8 may also be present. Alternatively or in addition, unlike in the illustration, a planarization layer may also be located between the first electrode 4 and the organic layer sequence 5. Such planarization layers 8, as described in relation to FIG. 6, may also optionally be present in all the other examples.

Figure 7:
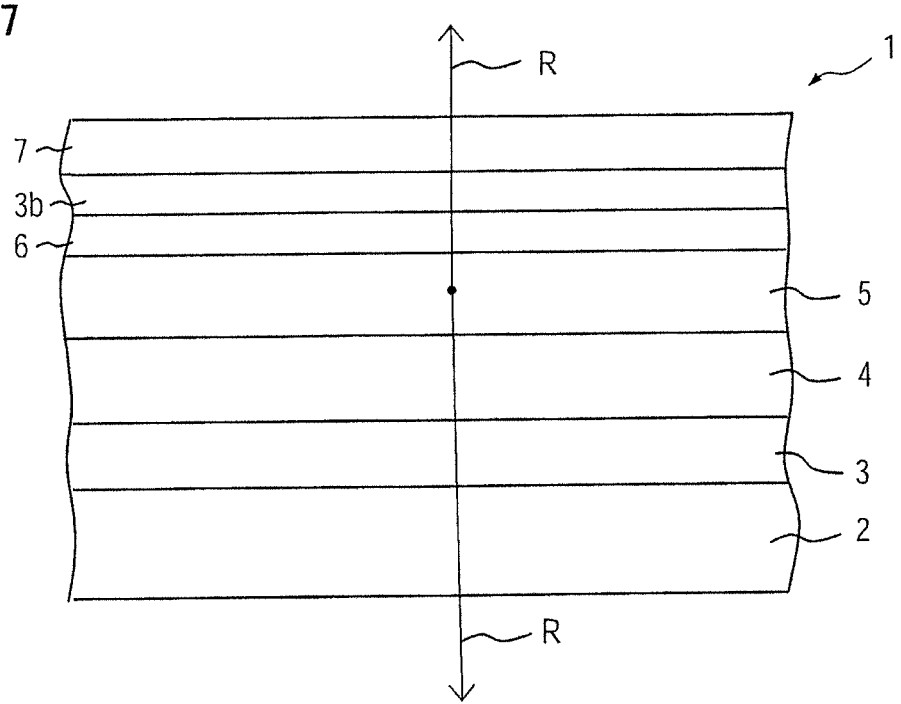

In the example according to FIG. 7, both the first electrode 4 and the second electrode 6 are transmissive to radiation R generated when the light-emitting diode 1 is in operation. Thus, the radiation R may be emitted at both major sides of the light-emitting diode 1. In this case, the second electrode 6 is preferably a multilayer electrode, which may be formed analogously to the first electrode 4. Optionally, a further scattering layer 3b is then located on the side of the second electrode 6 remote from the carrier substrate 2.

All the other examples may also, on the basis of the example according to FIG. 7, be bilaterally emitting light-emitting diodes, with appropriate modification of the second electrode 6 and optionally of the encapsulation layer 7 and/or of further components of the light-emitting diode 1, which are located on the side of the second electrode 6 remote from the carrier substrate 2.

The diodes described here are not restricted by the description given with reference to the examples. Rather, this disclosure encompasses any novel feature and any combination of features, including in particular any combination of features in the appended claims, even if the feature or combination is not itself explicitly indicated in the claims or examples.

The invention claimed is:

1. An organic light-emitting diode comprising:
   a carrier substrate;
   a scattering layer;
   a first electrode;

an organic layer sequence with at least one active layer; and a second electrode, wherein the carrier substrate, the scattering layer, the first electrode, the organic layer sequence and the second electrode are arranged in the stated sequence;

the scattering layer has a higher average refractive index than the organic layer sequence;

the first electrode has at least n or at least n+1 non-metal layers and n metal layers;

n is a natural number greater than or equal to 3;

the non-metal layers and the metal layers succeed one another alternately, the at least one active layer generates visible radiation when the light-emitting diode is in operation, a non-metal layer of the first electrode located closest to the organic layer sequence and a non-metal layer of the first electrode located closest to the carrier substrate form two peripheral non-metal layers of the first electrode, at least one or all of the non-peripheral non-metal layers of the first electrode has/have an optical thickness of $(m\lambda)/2$, with a tolerance of at most $0.1\lambda$, wherein m is a natural number greater than or equal to 1, and $\lambda$ is a peak wavelength of the radiation generated in the organic layer sequence, the visible radiation has a visible spectral range between 450 nm and 780 nm, and the peak wavelength $\lambda$ is that wavelength of the visible radiation at which a maximum spectral energy density is emitted by the light-emitting diode.

2. The organic light-emitting diode according to claim 1, wherein n=4 or n=5, the non-metal layers and the metal layers succeed one another directly, and the first electrode comprises precisely n+1 non-metal layers.

3. The organic light-emitting diode according to claim 1, wherein the first electrode has at least n+1 non-metal layers, wherein the two peripheral non-metal layers are each made from a transparent conductive oxide.

4. The organic light-emitting diode according to claim 1, wherein the second electrode is reflective, the first electrode is radiation-transmissive, radiation outcoupling out of the light-emitting diode proceeds through the carrier substrate.

5. The organic light-emitting diode according to claim 1, wherein the non-metal layers are each made of a transparent, conductive oxide and the metal layers consist of one or more of Ag, Al, Au, Cd, Co, Cr, Cu, Ge, In, Mg, Mn, Mo, Ni, Pd, Pt, Si, Sn, Ti, Zn and Zr.

6. The organic light-emitting diode according to claim 3, wherein a thickness of each of the metal layers is 1.5 nm to 7.5 nm, and the two peripheral non-metal layers of the first electrode each have a thickness of 12.5 nm to 70 nm.

7. The organic light-emitting diode according to claim 1, wherein at least one or all of non-peripheral non-metal layers of the non-metal layers has/have a thickness of 70 nm to 250 nm.

8. The organic light-emitting diode according to claim 1, wherein the second electrode comprises at least two sublayers of various materials.

9. The organic light-emitting diode according to claim 8, wherein the second electrode comprises precisely two sublayers, the first sublayer located closer to the organic layer sequence is formed from Ag or an Ag alloy and has a thickness of 20 nm to 60 nm, and the second sublayer is formed from Al or an Al alloy and has a thickness of 40 nm to 200 nm.

10. The organic light-emitting diode according to claim 1, wherein the scattering layer comprises a matrix material and scattering centers embedded therein, and a refractive index of the matrix material is at least 1.65.

11. The organic light-emitting diode according to claim 10, wherein a refractive index difference between the matrix material and a material of the scattering centers of the scattering layer amounts to at least 0.1, and an average geometric thickness of the scattering layer is 5 µm to 25 µm.

12. The organic light-emitting diode according to claim 1, wherein the organic layer sequence comprises at least two active layers, which succeed one another in the direction away from the carrier substrate.

13. The organic light-emitting diode according to claim 12, wherein at least one of the active layers is at an optical distance of $\frac{3}{4}\lambda$ from the second electrode, with a tolerance of at most $0.1\lambda$ and relative to the peak wavelength $\lambda$ of the radiation generated in the active layer.

14. The organic light-emitting diode according to claim 1, further comprising at least one charge carrier generation layer comprising an interlayer with or of a metal, a metal oxide or a metal halide located between an n-conductive and a p-conductive layer of the charge carrier generation layer, and the interlayer has an average thickness of 0.8 nm to 4.5 nm.

15. The organic light-emitting diode according to claim 1, wherein all of the non-peripheral non-metal layers of the first electrode have an optical thickness of $(m\lambda)/2$ with a tolerance of at most $0.1\lambda$.

16. An organic light-emitting diode comprising:

a carrier substrate, a scattering layer, a first electrode, an organic layer sequence having at least one active layer, wherein the at least one active layer generates visible radiation when the light-emitting diode is in operation, and a second electrode, wherein the carrier substrate, the scattering layer, the first electrode, the organic layer sequence and the second electrode are arranged in the stated sequence, the scattering layer has a higher average refractive index than the organic layer sequence, the first electrode has n+1 non-metal layers and n metal layers, the number of said non-metal layers being increased precisely by 1 relative to the number of said metal layers such that the non-metal layers and the metal layers succeed one another alternately, n is a natural number greater than or equal to 3, a non-metal layer of the first electrode located closest to the organic layer sequence and a non-metal layer of the first electrode located closest to the scattering layer form two peripheral non-metal layers of the first electrode, the non-metal layer located closest to the organic layer sequence has a thickness of 12.5 nm to 70 nm, the non-metal layer located closest to the scattering layer has a thickness of 12.5 nm to 70 nm, at least one or all of the non-peripheral non-metal layers of the first electrode have an optical thickness of $(m\lambda)/2$ with a tolerance of at most $0.1\lambda$, wherein m is a natural number greater than or equal to 1, and λ is a peak wavelength of the radiation generated in the organic layer sequence, and the peak wavelength λ is that wavelength of the visible radiation at which a maximum spectral energy density is emitted by the light-emitting diode.

17. The organic light-emitting diode according to claim 16, wherein the non-metal layer located closest to the organic layer sequence has a thickness of 5 nm to 20 nm, and the non-metal layer located closest to the scattering layer has a thickness of 40 nm to 60 nm.

18. The organic light-emitting diode according to claim 16, wherein the second electrode is reflective to radiation generated when the light-emitting diode is in operation, and the second electrode comprises at least two sublayers being formed of various materials and/or of various material compositions.

19. The organic light-emitting diode according to claim 18, wherein the second electrode is formed as a Bragg mirror comprising a sequence of layers of alternately high and low refractive index.

20. An organic light-emitting diode comprising:
a carrier substrate,
a scattering layer,
a first electrode,
an organic layer sequence having at least one active layer, and
a second electrode,
wherein
the carrier substrate, the scattering layer, the first electrode, the organic layer sequence and the second electrode are arranged in the stated sequence,
the scattering layer has a higher average refractive index than the organic layer sequence,
the first electrode has at least n or at least n+1 non-metal layers and n metal layers,
n is a natural number greater than or equal to 3;
the non-metal layers and the metal layers succeed one another alternately, and
both the first electrode and the second electrode are transmissive to the radiation generated when the light-emitting diode is in operation such that the generated radiation is emitted at both major sides of the light-emitting diode.

\* \* \* \* \*